(12) United States Patent
Eesley et al.

(10) Patent No.: US 6,840,307 B2
(45) Date of Patent: Jan. 11, 2005

(54) HIGH PERFORMANCE HEAT EXCHANGE ASSEMBLY

(75) Inventors: Gary Lynn Eesley, Davisburg, MI (US); Donald T. Morelli, White Lake, MI (US); Mohinder Singh Bhatti, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 9 days.

(21) Appl. No.: 09/804,756

(22) Filed: Mar. 13, 2001

(65) Prior Publication Data

US 2001/0032720 A1 Oct. 25, 2001

Related U.S. Application Data

(60) Provisional application No. 60/189,133, filed on Mar. 14, 2000.

(51) Int. Cl.[7] .................................................. F28F 7/00
(52) U.S. Cl. ..................... 165/80.3; 165/185; 165/905; 165/907; 361/703; 361/704; 361/708; 361/709; 257/707; 257/722; 174/16.3
(58) Field of Search ............................. 165/80.3, 185, 165/905, 907

(56) References Cited

U.S. PATENT DOCUMENTS

| 3,262,190 | A | * | 7/1966 | Rostoker et al. ........ 29/890.035 |
| 3,616,841 | A | * | 11/1971 | Walz ........................... 164/34 |
| 3,732,919 | A | * | 5/1973 | Wilson ........................ 165/110 |
| 3,780,356 | A | * | 12/1973 | Laing .......................... 257/714 |
| 3,946,039 | A | * | 3/1976 | Walz ........................... 264/628 |
| 4,064,914 | A | * | 12/1977 | Grant .......................... 138/142 |
| 4,222,434 | A | * | 9/1980 | Clyde ........................... 165/10 |
| 4,523,636 | A | * | 6/1985 | Meijer et al. ........... 165/104.26 |
| 4,714,049 | A | * | 12/1987 | McCoy et al. ............... 122/4 D |
| 4,715,438 | A | * | 12/1987 | Gabuzda et al. ............. 165/185 |
| 4,808,558 | A | * | 2/1989 | Park et al. ..................... 501/80 |
| 4,884,169 | A | * | 11/1989 | Cutchaw ..................... 361/700 |
| 5,123,982 | A | * | 6/1992 | Kuzay ....................... 156/89.28 |
| 5,145,001 | A | | 9/1992 | Valenzuela ................... 165/164 |
| 5,180,001 | A | * | 1/1993 | Okada et al. ............... 165/80.4 |
| 5,205,353 | A | * | 4/1993 | Willemsen et al. ......... 165/170 |
| 5,253,702 | A | * | 10/1993 | Davidson et al. ........... 165/80.4 |
| 5,304,845 | A | * | 4/1994 | Lindquist et al. ............ 257/722 |
| 5,315,154 | A | * | 5/1994 | Elwell ......................... 257/707 |
| 5,329,993 | A | * | 7/1994 | Ettehadieh ............. 165/104.14 |
| 5,441,716 | A | * | 8/1995 | Rockenfeller ............... 423/299 |
| 5,642,779 | A | * | 7/1997 | Yamamoto et al. ......... 165/185 |
| 5,666,269 | A | * | 9/1997 | Romero et al. ............. 361/699 |
| 5,727,622 | A | * | 3/1998 | Gurevich et al. ........... 165/80.3 |
| 5,751,062 | A | * | 5/1998 | Daikoku et al. ............. 257/722 |
| 5,888,469 | A | * | 3/1999 | Stiller et al. ............. 423/445 R |
| 6,196,307 | B1 | * | 3/2001 | Ozmat ......................... 165/185 |
| 6,237,223 | B1 | * | 5/2001 | McCullough ........... 29/890.032 |
| 6,411,508 | B1 | * | 6/2002 | Kang et al. .................. 361/695 |
| 6,424,529 | B2 | * | 7/2002 | Eesley et al. ................ 361/703 |
| 6,761,211 | B2 | * | 7/2004 | Bhatti et al. ................ 165/80.3 |
| 2002/0108743 | A1 | * | 8/2002 | Wirtz .......................... 165/185 |

FOREIGN PATENT DOCUMENTS

| KR | 2001035209 A | * | 1/2001 | ............. F28F/3/00 |

* cited by examiner

Primary Examiner—Henry Bennett
Assistant Examiner—Nihir Patel
(74) Attorney, Agent, or Firm—Patrick M. Griffin

(57) ABSTRACT

Heat sinks are provided that achieve very high convective heat transfer surface per unit volume. These heat sinks comprise a spreader plate, at least two fins and at least one porous reticulated foam block that fills the space between the fins.

15 Claims, 2 Drawing Sheets

HIGH PERFORMANCE HEAT EXCHANGE ASSEMBLY

CROSS-REFERENCE TO RELATED APPLICATIONS

This application claims the benefit of U.S. Provisional Patent Application Ser. No. 60/189,133, filed Mar. 14, 2000.

TECHNICAL FIELD

The present invention is directed to heat sinks primarily for use in dissipating waste heat generated by electrical and/or electronic components and assemblies. These heat sinks include a heat spreader plate and an assembly of heat conducting fins and reticulated foam structures that are bonded together. Electronic components are connected to one surface of the spreader plate with the assembly of fins and foam connected to another surface of the spreader plate in contact with a cooling fluid.

BACKGROUND OF THE INVENTION

High power electrical and electronic components continue to have an increasing demand for higher power dissipation within a relatively confined space. In order to provide for such higher power dissipation requirements while remaining suitably compact, several levels of thermal management are usually required at the device, sub-assembly and component level.

At the component level, various types of heat exchangers and heat sinks have been used that apply natural or forced convection or other cooling methods. A typical heat sink for electrical or electronic components is depicted in FIG. 1. As shown, the heat sink includes a heat spreader plate 10 to which metal fins 12 are attached. An electronic component is attached to face 14 of spreader plate 10 and a cooling fluid 16, such as air or water, is passed across fins 12 to dissipate the heat generated by the electronic component. For a given power level to be dissipated, the spreader plate size (i.e., area) and the fin length along the length of the cooling flow path can be calculated using known methods. Fin spacing and fin height are usually determined by known methods such as numerical modeling.

In demanding applications, the method of heat exchange is usually forced convection to the cooling fluid. In such systems, heat exchange can be improved by increasing the fin surface area exposed to the cooling fluid. This is accomplished by increasing the number of the fins per unit volume. However, there are limitations to achievable fin densities based upon manufacturing constraints and cooling fluid flow requirements.

Reticulated foams are also known in the art for their ability to conduct heat such as the metal foams disclosed in U.S. Pat. Nos. 3,616,841 and 3,946,039 to Walz, and the ceramic foams disclosed in U.S. Pat. No. 4,808,558 to Park et al. Metal foams have been sold under the trade name DUOCEL available from Energy Research and Generation, Inc., Oakland, Calif.

Until recently, metal and ceramic reticulated foams have not been adapted for use in heat sinks for dissipating waste heat from electronic components. However, these structures, especially when comprised of metal, make excellent heat exchangers because of their conductivity and their extremely high surface area to volume ratio. While earlier porous heat exchangers had up to 100 open cells per square inch, reticulated foam has up to 15,625 open cells per square inch. Reticulated foam is far more porous and has far more surface area per unit volume (1600 square feet/cubic foot) than heat exchangers having other structures. The pressure drop of fluids flowing through reticulated foam is also relatively low so that movement of a cooling fluid through the foam is practical.

Studies by Bastawros have now shown the efficacy of metallic foams in forced convection heat removal for cooling of electronics. See, Bastawros, A. -F., 1998, *Effectiveness of Open-Cell Metallic Foams for High Power Electronic Cooling*, ASME Conf. Proc. HTD-361-3/PID-3, 211–217, and Bastawros, A.-F., Evans, A. G. and Stone, H. A., 1998, *Evaluation of Cellular Metal Heat Transfer Media*, Harvard University report MECH 325, Cambridge, Mass. Bastawros demonstrated that the use of metallic foam improved heat removal rate with a moderate increase in the pressure drop. Bastawros' results were based on thermal and hydraulic measurements (on an open cell aluminum alloy foam having a pore size of 30 pores per inch) used in conjunction with a model based upon a bank of cylinders in cross-flow to understand the effect of various foam morphologies. The model prediction was extrapolated to examine the trade-off between heat removal and pressure drop. The measurements showed that a high performance cellular aluminum heat sink (i.e., aluminum foam) removed 2–3 times the usual heat flux removed by a pin-fin array with only a moderate increase in pressure drop.

SUMMARY OF THE INVENTION

A range of new heat sinks for electrical and electronic components is herein presented that provides for space-efficient heat exchange with low thermal resistance. These heat sinks are capable of removing the increased waste heat flux generated by today's higher power electronic systems.

In general, heat sinks of the present invention comprise a spreader plate, at least two fins and at least one porous reticulated foam block that fills the space between the fins. All materials are made from a heat conducting material. The fins and foam blocks form an assembly that is connected to one surface of the spreader plate. Electronic components to be cooled are preferably connected to an opposing surface of the spreader plate, but may be connected to any surface of the spreader plate suited for heat transfer.

The present invention further defines the preferred dimensional relationships for establishing the optimum fin spacing and fin height for the heat sinks provided herein. Devices produced using these dimensional relationships find particular use in cooling microelectronic components such as microprocessors.

DESCRIPTION OF THE PREFERRED EMBODIMENT

By the present invention, it has been discovered that heat sinks that use a combination of solid non-porous fins and highly porous reticulated foam can provide improved performance over known applications that use one or the other. It is fully contemplated that any combinations of fins and reticulated foam may be used in a wide variety of different applications to achieve improved cooling.

It has been further discovered that there are constraints on the volume and geometry of reticulated foam beyond which the use of additional foam will have little impact on the overall heat sink's ability to dissipate thermal power at a given flow rate (i.e., the performance). This is because the reticulated foam is not a fully dense material (e.g., aluminum foam has a density of about 10% of solid aluminum). Therefore, a high convective heat transfer surface area is achieved at the expense of reduced thermal conductivity.

Additionally, in microelectronic cooling applications such as for example for microprocessors, practical considerations relative to package size, air flow rate, pressure drop and noise limits can impose further constraints on possible configurations and dimensions. Nonetheless, using the methods of the present invention, suitable heat sinks can be produced.

Heat sinks of the present invention achieve very high convective heat transfer surface per unit volume. These heat sinks comprise a spreader plate, at least two fins and at least one porous reticulated foam block that fill the space between the fins. This basic structure may be expanded to any configuration comprising foam blocks in between at least two fins that are mounted onto surface of a spreader plate.

Primary heat transfer to the cooling fluid is by convection from the foam, with the fins and spreader plate being used to conduct heat from the connected heat source (i.e., the electronic component) into the foam. In air-to-air heat exchange (i.e., where air is being used as the cooling fluid), ambient air may be drawn in through the foam's open vertical side walls and exhausted through the foam's top surface, or vice versa.

Figure 1:
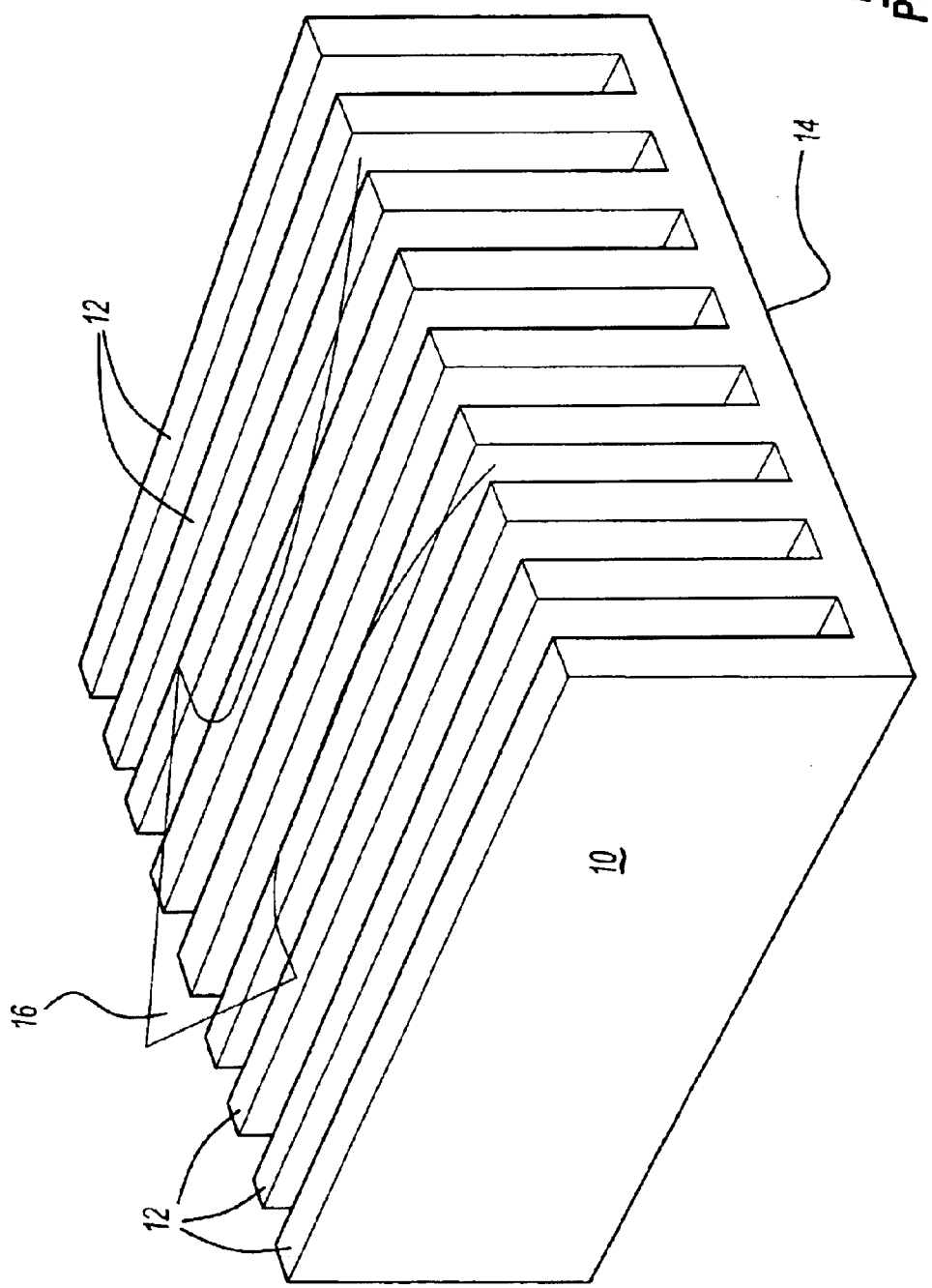
FIG. 1 shows a typical heat sink of the prior art.
Figure 2A:
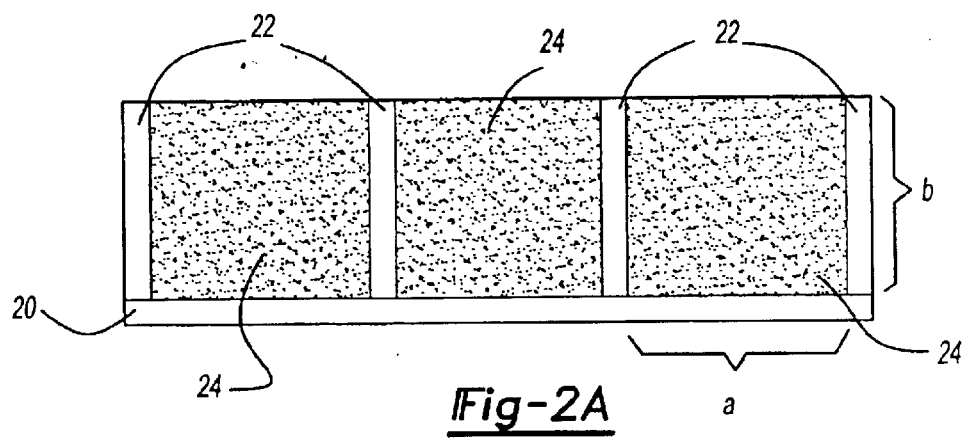
FIGS. 2a and 2b show the front and top views of the improved heat sink of the present invention.
Figure 2B:
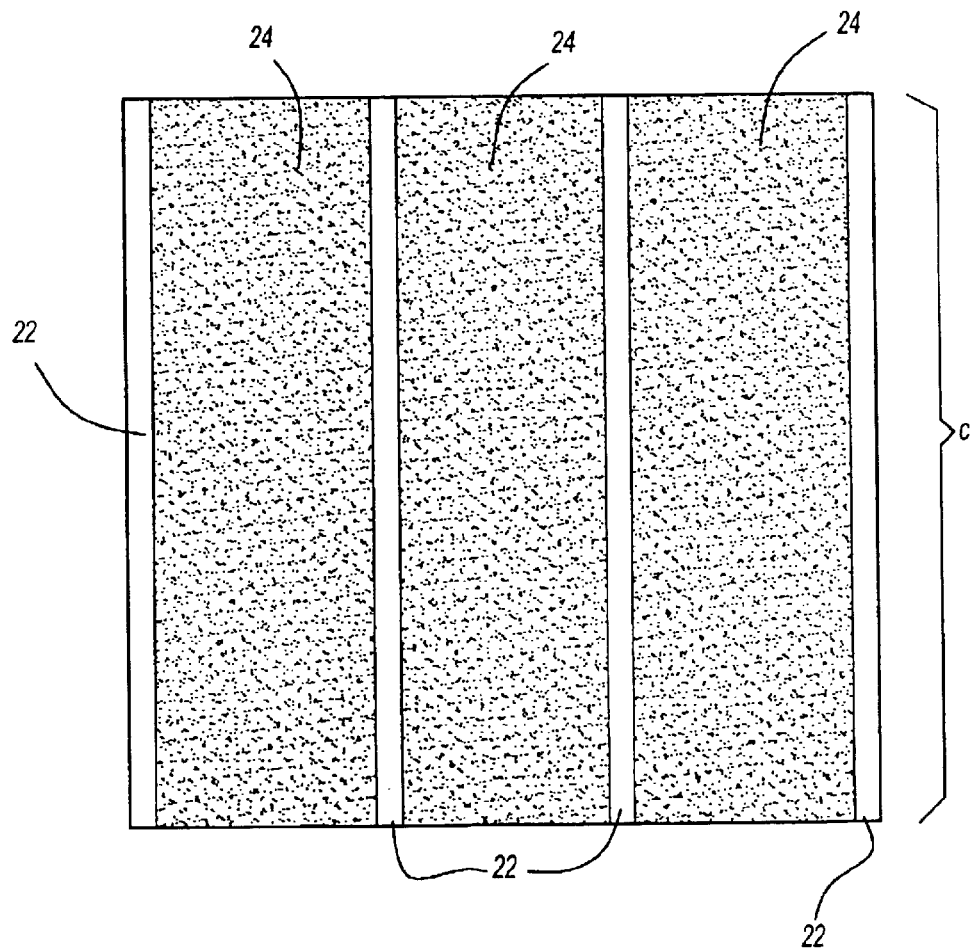

A preferred embodiment of the present invention is shown in FIG. 2a and FIG. 2b. As shown, the device comprises a heat spreader plate 20, with fins 22 and reticulated foam blocks 24 filling the space in-between the fins. The fins 22 and foam blocks 24 form an assembly that is mounted onto one surface of the spreader plate 20, leaving an opposing surface free for contact with an electronic component to be cooled.

Referring to FIG. 2a, fins 22 are mounted so that they are substantially perpendicular to the spreader plate 20. Foam blocks 24 are mounted in-between fins 22 to fill the width region that defines the horizontal space between adjacent fins. The foam blocks 24 also preferably fill the height region that defines the vertical space between adjacent fins to the height of the fins 22. While FIG. 2a shows that the foam blocks 24 fill the height region, it is contemplated that in alternative embodiments the foam blocks may partially fill or overfill the height region.

Referring to FIG. 2b, heat sinks of the present invention are configured such that the fins 22 are substantially parallel to one another and aligned along the length of the spreader plate 20.

The selection of spreader plate size and fin length along the cooling flow length, for a given power dissipation requirement, follow those techniques known in the art. The overall dimensions of the spreader plate are generally fixed based on the amount of heat to be dissipated from the surface of the heat source (such as a computer chip). The spreader plate surface area should be such that, for a prescribed flow rate of the cooling fluid flowing over the spreader plate, the heat from the heat source is able to spread to the edges of the spreader plate. Additional considerations may also be determinative of the spreader plate surface area such as packaging constraints.

Generally, however, spreader plate surface area is selected by multiplying the surface area of the heat source with the area magnification factor. The area magnification factor $\lambda = A_s/A_h$ represents a ratio of the surface area of the heat source $A_h$ with the surface area of the spreader plate $A_s$. Typical values of $\lambda$ are in the range of 8 to 12, and are generally used in calculating spreader plate surface area for a given surface area of a heat source. From the standpoint of heat removal efficiency, $\lambda$ should be as low as possible. Highly effective heat transfer surfaces such as highly conductive fins of optimized dimensions and/or the use of heat transfer augmentation means such as reticulated foam provide for relatively low values of $\lambda$. For example, in the present invention, if the surface area of the heat source is 1.5 in$^2$ and the selected area magnification factor is taken as $\lambda=8$ (for highly efficient transfer), then the surface area of the spreader plate will be $8 \times 1.5 = 12$ in$^2$. For a spreader plate of this area, packaging considerations could prescribe a length of the plate in the flow direction to be 4 in. Then the width of the spreader plate will be 3 in.

The number of fins and the fin length in the flow direction can be determined following calculation of fin spacing. For example, based on the applicable heat transfer considerations, if the fin spacing a=0.5938 in. and the fin thickness $\delta_f=0.125$ in., then the maximum number of fins n can be determined as follows. The width of the spreader plate is equal to the space occupied by n fins, $n\delta_f$, plus the space taken up by the inter-fin gaps, (n−1)a. For a spreader plate having a width of 3 inches, the number of fins can be calculated from the equation, $n\delta_f+(n-1)a=3$ in. Using $\delta_f=0.125$ in., a=0.5938 in., and solving for n, the number of fins is equal to 5.

In preferred heat sinks of the present invention, the fin (and foam) height are optimized according to the following formulas. Based on heat transfer considerations, the optimum fin height (as shown in FIG. 2a), b, is determined using the relation, $$b = 0.6498\sqrt{\frac{k_f \delta_f}{h}} \quad (1)$$

where, $k_f$ is the thermal conductivity of the selected fin material, Btu/ft s °F.

$\delta_f$ is the fin thickness, ft h is the convective heat transfer coefficient for the foam-filled space bounded by the fins and the spreader plate, Btu/ft$^2$ s °F., and where h is given by the formula, $$h = 1.2704\left[\frac{n^{0.50}}{(1-\phi)^{0.25}}\right]\left(\frac{\rho^{0.50}k^{0.63}c_p^{0.37}}{\mu^{0.13}}\right)u_m^{0.50} \quad (2)$$

where, n is the linear density of the foam material, pores per ft $\phi$ is the foam porosity expressed as a fraction $\rho$ is the density of the flowing fluid, lb$_m$/ft$^3$ k is the thermal conductivity of the flowing fluid, Btu/ft s °F.

$c_p$ is the isobaric specific heat of the flowing fluid, Btu/lb$_m$ °F.

$\mu$ is the dynamic viscosity of the flowing fluid, lb$_m$/ft s $u_m$ is the mean velocity of the flowing fluid, ft/s Based on heat transfer considerations, the minimum fin spacing $\delta$ is determined by the relation, $$\delta = 7.32\sqrt{\frac{kc}{\rho c_p u_m}} \quad (4)$$

where, c is the fin length in the flow direction (as shown in FIG. 2b), ft k is the thermal conductivity of the flowing fluid, Btu/ft s ° F.

$\rho$ is the density of the flowing fluid $lb_m/ft^3$ $c_p$ is the isobaric specific heat of the flowing fluid, Btu/$lb_m$ ° F.

$u_m$ is the mean velocity of the flowing fluid, ft/s.

To maximize thermal conduction from the heat source through the spreader plate into the fins and foam, the fins and foam are bonded to one another and the spreader plate. While thermal bonding such as brazing is preferred, any suitable means may be employed including, for example, using a conductive epoxy to form an adhesive bond. In preferred heat sinks of the present invention, the fins, the foam blocks and the spreader plate are assembled and then preferably furnace-brazed to bond the foam to the fins and the spreader plate.

The spreader plate and fins are solid and made from thermal conducting materials known in the art. The reticulated foam is an open cell media and also made from known thermal conducting materials. Preferred thermal conducting materials include aluminum, copper, graphite and aluminum-nitride ceramics. The spreader plate, fins and the reticulated foam may be selected from the same or different materials. In a preferred embodiment, the selected thermal conducting material for the spreader plate, fins and the reticulated foam is aluminum.

The reticulated foam structure is available from commercial sources or may be made by methods known in the art. Suitable processes for making metal foams are disclosed in U.S. Pat. Nos. 3,616,841 and 3,946,039 to Walz, and processes for making ceramic foams are disclosed in U.S. Pat. No. 4,808,558, the teachings of which are incorporated herein by reference. Reticulated foam metal can be formed by the manufacturer to have many shapes, densities and cell sizes. Foam blocks as used herein may be obtained from such manufacturers or cut from larger pieces. Aluminum foams suitable for use herein are available under the tradename DUOCEL from Energy Research and Generation, Inc., Oakland, Calif.

The following examples are provided to illustrate heat sinks of the present invention designed for microelectronic cooling applications using the relationships set forth above and based upon a power dissipation requirement of up to about 200 watts.

EXAMPLE 1

In a heat sink of the present invention, aluminum fins are selected having a thickness $\delta_f=0.125$ inch (0.0104 ft) with thermal conductivity $k_f=133$ Btu/ft hr° F. (0.0369 Btu/ft s ° F.). The fin length c in the flow direction, dictated by the packaging and heat dissipation consideration, is 4 inches (0.3333 ft). A commercially available open cell aluminum foam with linear density of n=20 pores per inch (240 pores/ft) and a porosity $\phi=0.90$ is also selected. The cooling medium is ambient air flowing with a mean velocity $u_m=10$ ft/s. The transport properties of the ambient air are as follows:

Density $\rho=0.0749$ $lb_m/ft^3$
Thermal conductivity k=0.0000041 Btu/ft s ° F.
Isobaric specific heat $c_p=0.2410$ Btu/$lb_m$ ° F.
Dynamic viscosity $\mu=0.0000123$ $lb_m/ft$ s To determine optimum fin height b, the convective heat transfer coefficient h is first determined using Equation (2), above, providing h=0.0313 Btu/$ft^2$s ° F. Next, introducing this value of h into Equation (1), above, we obtain the optimum fin height b=0.0721 ft. (0.8646 inch).

To determine the optimum fin spacing a, the minimum fin spacing $\delta$ is first determined using Equation (4), to obtain $\delta=0.0201$ ft. (0.2417 inch). Then, using Equation (3) and selecting the factor $\Phi=2.5$ results in an optimum fin spacing a=0.6043 inch.

EXAMPLE 2

This example is the same as Example 1 except that the fin material has been changed from aluminum to copper. The copper fins have a thickness $\delta_f=0.125$ inch (0.0104 ft) and thermal conductivity $k_f=226$ Btu/ft hr ° F. (0.0628 Btu/ft s ° F.). The fin length c in the flow direction, dictated by the packaging and heat dissipation consideration, is 4 inches (0.3333 ft). The reticulated foam is a commercially available open cell aluminum foam having a linear density n=20 pores per inch (240 pores/ft) and a porosity $\phi=0.90$. The cooling medium is ambient air flowing with a mean velocity $u_m=10$ ft/s. The transport properties of the ambient air are as follows.

Density $\rho=0.0749$ $lb_m/ft^3$
Thermal conductivity k=0.0000041 Btu/ft s ° F.
Isobaric specific heat $c_p=0.2410$ Btu/$lb_m$ ° F.
Dynamic viscosity $\mu=0.0000123$ $lb_m/ft$ s As in Example 1, using Equation (2), the convective heat transfer coefficient h=0.0313 Btu/$ft^2$ s ° F. Then, using Equation (1), we obtain the optimum fin height b=0.0939 ft (1.1271 inch). This optimal height of the copper fin is 30% higher than that for the aluminum fin indicating that for the same fin thickness, the copper fin has higher heat dissipation potential than aluminum fin. This can be attributed to the higher thermal conductivity of copper.

Optimum fin spacing a follows Example 1. The minimum fin spacing $\delta$ is first determined using Equation (4), to obtain $\delta=0.0201$ ft. (0.2417 inch). Then, using Equation (3) and selecting the factor $\Phi=2.5$ results in an optimum fin spacing a=0.6043 inch.

While the preferred embodiment of the present invention has been described so as to enable one skilled in the art to practice the heat sinks disclosed, it is to be understood that variations and modifications may be employed without departing from the concept and intent of the present invention as defined by the following claims. The preceding description and examples are intended to by exemplary and should not be read to limit the scope of the invention. The scope of the invention should be determined only by reference to the following claims.

What is claimed is:

1. A heat sink for electrical or electronic components comprising:

a heat spreader plate to which the components to be cooled are connected;

at least two heat conducting fins that are positioned substantially parallel to one another and which are connected substantially perpendicular to said heat spreader plate;

at least one foam block that is disposed in the space between parallel fins wherein said block is formed of reticulated foam to define a highly porous, heat conducting, open-celled structure that permits a cooling fluid to flow through said block as the cooling fluid passes across said fins; and said at least one foam block being made from aluminum, copper, graphite, or aluminum-nitride ceramic wherein the fin height, b, is determined by the relationship, $$b = 0.6498\sqrt{\frac{k_f \delta_f}{h}}$$

where, $k_f$ is the thermal conductivity of the selected fin material, Btu/ft s ° F.

$\delta_f$ is the fin thickness, ft h is the convective heat transfer coefficient for the foam-filled space bounded by said fins and said heat spreader plate, Btu/ft² s ° F., and where h is given by the formula, $$h = 1.2704\left[\frac{n^{0.50}}{(1-\phi)^{0.25}}\right]\left(\frac{\rho^{0.50} k^{0.63} c_p^{0.37}}{\mu^{0.13}}\right) u_m^{0.50}$$

where, h is the linear density of said at least one foam block, pores per ft

φ is the porosity of said at least one foam block, expressed as a fraction

ρ is the density of the cooling fluid that passes across said fins, $lb_m/ft^3$ k is the thermal conductivity of the cooling fluid, Btu/ft s ° F.

$c_p$ is the isobaric specific heat of the cooling fluid, Btu/$lb_m$ ° F.

μ is the dynamic viscosity of the cooling fluid, $lb_m$/ft s $u_m$ is the mean velocity of the cooling fluid, ft/s.

2. A heat sink for electrical or electronic components comprising:

a heat spreader plate to which the components to be cooled are connected;

at least two heat conducting fins that are positioned substantially parallel to one another and which are connected substantially perpendicular to said heat spreader plate;

at least one foam block that is disposed in the space between parallel fins wherein said block is formed of reticulated foam to define a highly porous, heat conducting, open-celled structure that permits a cooling fluid to flow through block as the cooling fluid passes across said fins; and said at least one foam block being made from aluminum, copper, graphite, or aluminum-nitride ceramic wherein the fin spacing, a, is determined by the relationship, $$a = \Phi \delta$$

where,

Φ is between 1 to 6

δ, ft, is determined by the relation, $$\delta = 7.32\sqrt{\frac{kc}{\rho c_p u_m}}$$

where, c is the selected fin length in the flow direction, ft k is the thermal conductivity of the cooling fluid that passes across said fins, Btu/ft s ° F.

ρ is the density of the cooling fluid $lb_m/ft^3$ $c_p$ is the isobaric specific heat of the cooling fluid, Btu/$lb_m$° F.

$u_m$ is the mean velocity of the cooling fluid, ft/s.

3. A heat sink of claim 1 wherein said heat spreader plate, said fins and said at least one foam block are made from the same or different thermal conducting materials.

4. A heat sink of claim 1 wherein said heat spreader plate and said fins are made from aluminum, copper, graphite or aluminum-nitride ceramic.

5. A heat sink of claim 1 wherein said heat spreader plate and said fins are made from aluminum.

6. A heat sink of claim 1 wherein said fins and said at least one foam block are connected to one surface of said heat spreader plate.

7. A heat sink of claim 1 wherein said at least one foam block is further defined as a plurality of foam blocks.

8. A heat sink of claim 7 wherein said fins are connected to said heat spreader plate through thermal bonding.

9. A heat sink of claim 7 wherein said fins are connected to said foam blocks through thermal bonding.

10. A heat sink of claim 8 wherein said fins are connected to said foam blocks through thermal bonding.

11. A heat sink of claim 1 wherein said fins are connected to said heat spreader plate through thermal bonding.

12. A heat sink of claim 1 wherein said fins are connected to said at least one foam block through thermal bonding.

13. A heat sink of claim 11 wherein said fins are connected to said at least one foam block through thermal bonding.

14. A heat sink for electrical or electronic components comprising:

a heat spreader plate to which the components to be cooled are connected;

at least two heat conducting fins that are positioned substantially parallel to one another and which are connected substantially perpendicular to said heat spreader plate;

at least one foam block that is disposed in the space between parallel fins wherein said block is formed of reticulated foam to define a highly porous, heat conducting, open-celled structure that permits a cooling fluid to flow through said block as the cooling fluid passes across said fins; and said at least one foam block being made from aluminum, copper, graphite, or aluminum-nitride ceramic, wherein the fin height, b, is determined by the relationship, and $$b = 0.6498\sqrt{\frac{k_f \delta_f}{h}}$$

where, $k_f$ is the thermal conductivity of the selected fin material, Btu/ft s °F.

$\delta_f$ is the fin thickness, ft h is the convective heat transfer coefficient for the foam-filled space bounded by said fins and said heat spreader plate, Btu/ft² s °F., and where h is given by the formula, $$h = 1.2704\left[\frac{n^{0.50}}{(1-\phi)^{0.25}}\right]\left(\frac{\rho^{0.50}k^{0.63}c_p^{0.37}}{\mu^{0.13}}\right)u_m^{0.50}$$

where, n is the linear density of said at least one foam block, pores per ft

φ is the porosity of said at least one foam block, expressed as a fraction

ρ is the density of the cooling fluid that passes across said fins, $lb_m/ft^3$ k is the thermal conductivity of the cooling fluid, Btu/ft s °F.

$c_p$ is the isobaric specific heat of the cooling fluid, Btu/$lb_m$° F.

μ is the dynamic viscosity of the cooling fluid, $lb_m$/ft s $u_m$ is the mean velocity of the cooling fluid, ft/s and a heat spreader plate to which the components to be cooled are connected;

at least two heat conducting fins that are positioned substantially parallel to one another and which are connected substantially perpendicular to said heat spreader plate;

at least one foam block that is disposed in the space between parallel fins wherein said block is formed of reticulated foam to define a highly porous, heat conducting, open-celled structure that permits a cooling fluid to flow through said block as the cooling fluid passes across said fins; and said at least one foam block being made from aluminum, copper, graphite, or aluminum-nitride ceramic wherein the fin spacing, a, is determined by the relationship, $$a = \Phi\delta$$

where,

Φ is between 1 to 6

δ, ft, is determined by the relation, $$\delta = 7.32\sqrt{\frac{kc}{\rho c_p u_m}}$$

where, c is the selected fin length in the flow direction, ft k is the thermal conductivity of the cooling fluid that passes across said fins, Btu/ft s °F.

ρ is the density of the cooling fluid lbm/ft3 cp is the isobaric specific heat of the cooling fluid, Btu/lbm° F.

um is the mean velocity of the cooling fluid, ft/s.

15. A heat sink of claim 7 wherein said fins and said foam blocks are connected to one surface of said heat spreader plate.

* * * * *